United States Patent [19]

Thibault et al.

[11] 4,114,256
[45] Sep. 19, 1978

[54] RELIABLE METAL-TO-JUNCTION CONTACTS IN LARGE-SCALE-INTEGRATED DEVICES

[75] Inventors: Louis Robert Thibault, Piscataway; Leopoldo Dy Yau, New Providence, both of N.J.

[73] Assignee: Bell Telephone Laboratories, Incorporated, Murray Hill, N.J.

[21] Appl. No.: 809,667

[22] Filed: Jun. 24, 1977

[51] Int. Cl.² ............................................. B01J 17/00
[52] U.S. Cl. .................................... 29/571; 29/578; 29/590
[58] Field of Search ...................... 29/571, 578, 590

[56] References Cited

U.S. PATENT DOCUMENTS 4,033,026  7/1977  Pashley ................................ 29/571

*Primary Examiner*—W. Tupman
*Attorney, Agent, or Firm*—Lucian C. Canepa

[57] ABSTRACT

A self-aligned technique for making metal-to-junction contacts in a shallow-junction large-scale-integrated device involves opening very small contact windows in the intermediate insulating layer of the device. These windows respectively overlie only limited central regions of the junctions. Impurities are then applied via the contact windows to provide deeper junction portions directly below the windows. As a result, metallic contact regions subsequently deposited in the windows are exactly aligned with respect to the deeper junction portions. Penetration or spiking of the junctions by the metallic regions is thereby significantly reduced.

1 Claim, 3 Drawing Figures

RELIABLE METAL-TO-JUNCTION CONTACTS IN LARGE-SCALE-INTEGRATED DEVICES

BACKGROUND OF THE INVENTION

The invention relates to the fabrication of shallow-junction integrated devices and, more particularly, to the formation of reliable metal-to-junction contacts in such devices.

A variety of large-scale-integrated (LSI) devices of practical importance include very shallow junctions. For example, in some so-called short-channel metal-oxide-semiconductor (MOS) LSI devices, junction depths are reduced to submicron values in order to minimize overlap capacitance between the gate electrodes and their associated source-drain junction regions. But, as junctions become shallower, the likelihood increases that metals included in contact window portions of the device to make electrical connections to the junction regions will penetrate or spike through the junctions during sintering. In practice, metals such as aluminum have been known to penetrate junctions whose depths are less than one micron.

Various schemes have been proposed to minimize the occurrence of the aforedescribed spiking problem in shallow-junction LSI devices. Some proposals involve relatively elaborate metallization systems. These are often not attractive, however, because of the additional processing complexity they entail.

Another solution to the specified problem is described in U.S. Pat. No. 3,747,203. As shown for example, in FIGS. 8 through 10 thereof, that solution involves first forming a relatively deep central junction region. Thereafter, relatively shallow lateral extensions of the deep region are formed. But, if that technique is applied to the fabrication of conventional LSI devices, it will require a subsequent masking step to open contact windows in an additional insulating layer that would typically be deposited on top of the structure depicted in FIG. 10 of U.S. Pat. No. 3,747,203. Moreover, aligning such subsequently formed contact windows with respect to the deep junction regions is in practice a formidable problem. Unless precise alignment therebetween is achieved, the windows may overlie some part of the shallow lateral extensions of the junctions. In that case, penetration of the shallow extensions by the metallic contact material might occur.

Accordingly, continuing efforts have been directed at trying to devise simple and reliable techniques for making metal-to-junction contacts in shallow-junction LSI devices. It was recognized that such techniques if available would significantly advance the art of making such devices.

SUMMARY OF THE INVENTION

Hence, an object of the present invention is an improved fabrication sequence for making LSI devices.

More specifically, an object of this invention is a self-aligned technique for making metal-to-junction contacts in shallow-junction LSI devices.

Briefly, these and other objects of the present invention are realized in a specific illustrative fabrication sequence that involves opening contact windows in the intermediate insulating layer of a shallow-junction LSI device. Impurities are then applied via the contact windows to provide relatively deep junction portions directly below the windows. At the same time, adjacent shallow portions of the junctions remain substantially unaffected and the surface conductivity of the device in the window areas is enhanced. Metallic contact regions are subsequently deposited in the windows. These regions are exactly aligned with respect to the deeper junction portions and provide very-low-resistance metal-to-junction contacts. Importantly, penetration of the junctions by the self-aligned metallic contact material is thereby significantly reduced.

BRIEF DESCRIPTION OF THE DRAWING

A complete understanding of the present invention and of the above and other objects, features and advantages thereof may be gained from a consideration of the following detailed description presented hereinbelow in connection with the accompanying drawing, in which.

DETAILED DESCRIPTION

For purposes of a specific illustrative example, applicants' unique processing sequence will be described hereinbelow as applied to the fabrication of a particular MOS LSI device. But it is to be understood that applicants' inventive concepts are general purpose in nature and may also be applied, for example, to the batch fabrication of other microminiature devices such as bipolar and gallium-arsenide field-effect-transistor arrays.

Moreover, although applicants' inventive techniques are applicable to fabricating devices by any lithographic process, it has been found to be particularly advantageous to employ applicants' techniques in conjunction with electron beam lithographic processes. One exemplary apparatus with which to carry out electron beam lithography is described in U.S. Pat. No. 3,900,737, issued Aug. 19, 1975 to R. J. Collier and D. R. Herriott, entitled "Electron Beam Exposure System." With such a computer-controlled system, it is feasible to precisely delineate the successive patterns required to fabricate LSI devices. Feature dimensions of only a few microns or less and alignment tolerances less than one micron are thereby achievable.

An advantageous modification of the Collier-Herriott system is described in a commonly assigned copending application of R. J. Collier and M. G. R. Thomson, Ser. No. 655,427, filed Feb. 5, 1976 now abandoned. In this modification, the pattern-writing speed of the system is significantly increased by utilizing a new mode of raster scanning. In the new mode, the writing spot dimensions of the scanning electron beam are varied in a high-speed way during the raster scanning process.

The systems described in the aforecited Collier-Herriott patent and in the Collier-Thomson application may be utilized to fabricate a set of high-precision masks. In turn, the masks are employed in succession in connection with standard photolithographic or x-ray-lithographic techniques to define prescribed patterns on an associated resist-coated wafer. In that way, an MOS LSI device of the type described herein may be fabricated.

Alternatively, a system of the type described in the Collier-Herriott patent or in the Collier-Thomson application may be operated in a so-called direct writing mode. In that mode, an electron-resist-coated wafer is directly irradiated in a high-speed way by a scanning electron beam to define high-resolution features. Hereinafter, for illustrative purposes, it will be assumed that the particular MOS LSI devices to be described herein are fabricated by utilizing an electron beam exposure system operating in its direct writing mode. In practice, advantageous LSI devices embodying applicants' inventive concepts have been thereby achieved.

Figure 1:
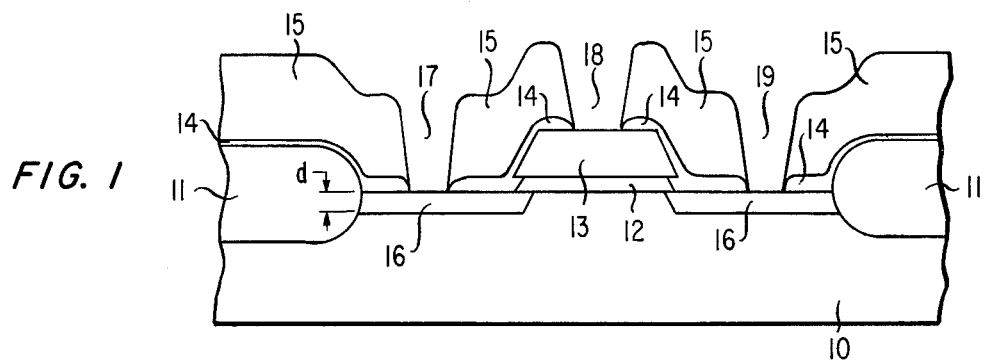
FIGS. 1 and 2 each comprise a cross-sectional representation of a portion of a specific illustrative MOS LSI device made in accordance with the principles of the present invention at successive fabrication stages thereof.

FIG. 1 shows in cross-sectional side view a portion of a partially fabricated MOS LSI device that includes a multiplicity of field-effect transistors each including gate, source and drain electrodes. The depicted portion includes a number of conventional elements. These include a p-type silicon substrate 10, so-called field oxide layers 11 made of silicon dioxide, a gate oxide layer 12 made of silicon dioxide, a doped polysilicon portion 13 that serves as the conductive gate electrode of one field-effect transistor in the LSI device, relatively thin layers 14 of thermally grown silicon dioxide and a patterned relatively thick insulating layer 15. Illustratively, the layer 15, which constitutes the so-called intermediate insulator of the devices, is made of phosphorus-doped silicon dioxide.

The device shown in FIG. 1 also includes diffused or implanted $n^+$ regions 16 that serve as the source and drain regions of the depicted transistor. In accordance with applicants' inventive fabrication technique, the regions 16 as initially made are uniformly shallow portions formed by introducing an n-type dopant such as arsenic into the substrate 10. Illustratively, the depth $d$ of the regions 16 is extremely shallow. In some devices of practical importance, $d$ has a value in the range 0.1 to 0.5 microns.

The device shown in FIG. 1 includes three contact window openings 17 through 19 formed in the intermediate insulating layer 15. These openings can be formed in the layer 15 in accordance with various conventional lithographic techniques. When, however, these openings are specified to be extremely small (for example about 1.5-by-1.5 microns), it is advantageous to form them in accordance with the unique fabrication procedure described in applicants' copending commonly assigned application, Ser. No. 805,408, filed June 10, 1977.

However formed, the openings 17 through 19 shown in FIG. 1 provide access through the intermediate insulator 15 to establish electrical connections to the gate, source and drain regions of the depicted transistor. Conventionally, a metal such as aluminum (not shown in FIG. 1) is then deposited directly on the top surface of the layer 5 and in the contact window openings 17 through 19 in accordance with a prescribed interconnection pattern. But, as specified earlier above, such a metal can during subsequent processing steps penetrate or spike through a portion of one or both of the junctions formed between the regions 16 and the substrate 10. Such penetration shorts the junction(s) and renders the transistor inoperative.

It is known (as described, for example, in applicants' aforecited copending application) to interpose a thin buffer layer such as a thin film of doped polysilicon in the contact windows between the contact metal and the top surfaces of the junction regions 16. Such a thin film can block the overlying metallic contact material from penetrating into the regions 16 during fabrication of the LSI device. But this expedient requires several additional processing steps which fabricators generally would like, if possible, to avoid.

In accordance with the principles of applicants' invention, the junction profile of the depicted device is selectively altered in a simple self-aligned way. This is done by introducing impurities via the contact window openings 17 through 19 formed in the intermediate insulating layer 15. Advantageously, an n-type dopant having a higher diffusivity than that of the dopant initially employed to form the shallow junction regions 16 is used for this purpose. In the particular illustrative case in which arsenic constituted the initial dopant, phosphorus is a suitable additional dopant with which to selectively alter the junction profile. Phosphorus is characterized by a diffusion coefficient that is three to four times greater than that of arsenic.

Illustratively, the additional dopant is introduced into the junction regions 16 of FIG. 1 by conventional ion implantation techniques. In a standard way, the energy of the ion beam can be selected, for example, to implant the impurity peak within, at or just below the previously defined shallow junction. Advantageously, the dose of the beam is selected to significantly enhance the conductivity of the exposed surface regions in the contact windows. During conventional subsequent high-temperature processing of the LSI device, the additional introduced dopant moves downward and laterally to a substantial extent while the initial dopant, which is advantageously characterized by a much smaller diffusion coefficient, moves relatively little. The resulting junction profiles are shown in idealized form in FIG. 2.

Figure 2:
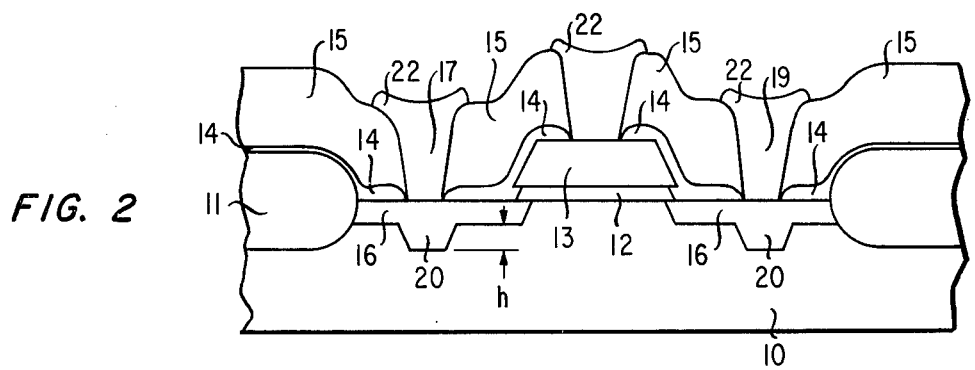

Significantly, the newly formed relatively deep portions 20 of the junction regions 16 shown in FIG. 2 are self-aligned with respect to the contact windows 17 and 19. Accordingly, metallic contact material subsequently deposited in the windows 17 and 19 is disposed directly above and centrally positioned with respect to the deep portions 20. As a result, there is much less chance of penetration of the junctions by the metallic material during processing of the device. In FIG. 2, the aforespecified metallic material is designated by reference numeral 22. Various standard techniques are known in the art for depositing a conductive layer on the depicted device and then selectively patterning the layer by high-resolution lithography. In that way, conductive elements, including the portions 22 shown in FIG. 2, are formed on the device to electrically interconnect the multiple gate, source and drain regions thereof in accordance with a prescribed pattern.

In one specific illustrative embodiment of the principles of the present invention, the junctions formed between the deep portions 20 (FIG. 2) and the p-type substrate 10 are located approximately two microns below the junctions initially formed in the device. In other words, as indicated in FIG. 2, the distance $h$ is about two microns. In that way a safe margin is provided to ensure that any metal that enters the junction regions 16 will not penetrate the relatively deep junctions located directly below the contact windows 17 and 19. At the same time, the lateral shallow-junction portions of the regions 16 remain substantially unaffected, whereby the known advantageous characteristics of such a shallow-junction device are preserved.

Alternatively, the junction profile shown in FIG. 2 may be formed by diffusing a suitable dopant such as phosphorus into the junction regions 16 via the contact windows 17 and 19 before a conductive material is deposited in the windows. In some cases of practical importance, the device being fabricated is scheduled to be subjected to a conventional phosphorus gettering step. In such a step, damage sites are removed from the device and the junction characteristics thereof are thereby improved. In accordance with one aspect of the principles of the present invention, that step, if prescribed, is sequenced to occur after contact windows have been opened in the intermediate insulating layer 15 of FIG. 1. In that way, gettering of damage sites from both the front and back surfaces of the device is carried out and, at the same time, phosphorus is diffused via the contact windows 17 and 19 into the junction regions 16 to form the junction profile depicted in FIG. 2. Of course if a gettering step is not included in the fabrication sequence of the device being made, the deep junction portions 20 (FIG. 2) may be formed in a separate diffusion step.

Figure 3:
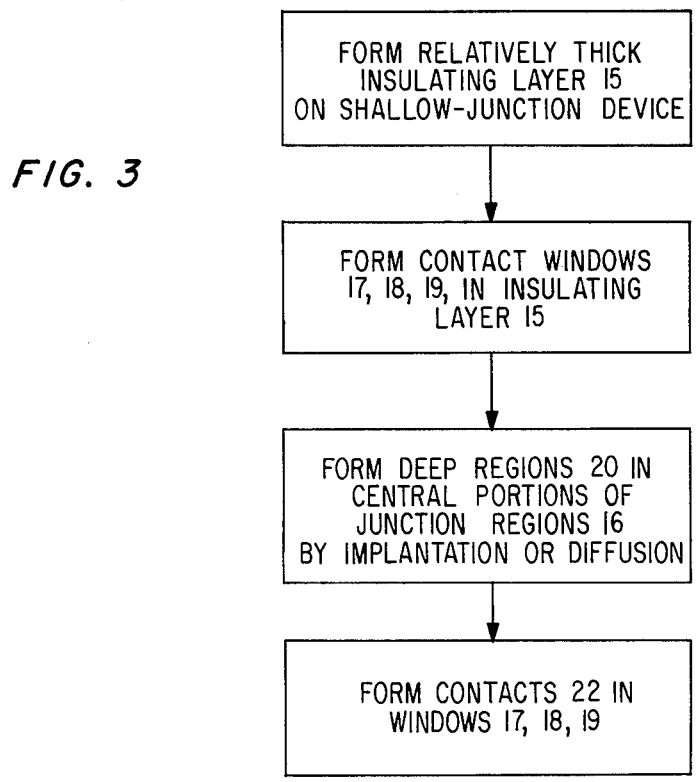
FIG. 3 lists a set of processing steps involved in fabricating the particular device shown in FIGS. 1 and 2.

Applicants' herein-described inventive procedure, as illustratively applied to the fabrication of a particular MOS LSI device, is summarized in FIG. 3. Each step listed in FIG. 3 includes specific references to the structure shown in FIGS. 1 and 2.

Finally, it is to be understood that the above-described arrangements and procedures are only illustrative of the application of the principles of the present invention. In accordance with those principles, numerous other structural configurations and processing techniques may be devised by those skilled in the art without departing from the spirit and scope of the invention. For example, although primary emphasis herein has been directed to forming contact windows overlying central regions of shallow junctions, the windows may be other than centrally located in other embodiments of applicants' invention. Thus, for instance, in a shallow-junction depletion-mode field-effect transistor or in a shallow diffused resistor structure, the contact windows would typically overlie limited-extent end portions of the shallow regions. Furthermore, it is to be understood that it is not an essential requirement of applicants' inventive technique that the impurity introduced through the windows to form the deep-junction regions have a higher diffusivity than that of the impurity initially utilized to form the shallow-junction regions. It is feasible, for example, in accordance with applicants' teachings to implant an impurity via the windows sufficiently deep that the matter of its diffusivity relative to that of the impurity utilized to form the shallow junctions becomes relatively unimportant. In that case, the diffusion coefficient of the implanted impurity may, for example, be approximately the same as that of the impurity utilized to form the shallow-junction regions.

What is claimed is:

1. A method for making reliable low-resistance electrical connections to shallow-junction regions of an LSI device, said method comprising the steps of forming a relatively thick insulating layer on the front surface of said device overlying said shallow-junction regions forming contact window openings in said insulating layer respectively overlying only central portions of said shallow junction regions, in a single gettering step, gettering damage sites from both the front and back surfaces of said device and, during said single gettering step, introducing an impurity into said device via said contact window openings to form relatively deep junction portions in the central portions only of said shallow-junction regions in direct alignment with said openings, and forming a conductive pattern on said insulating layer and in said contact window openings directly overlying said relatively deep junction portions to establish electrical connections to said regions.

* * * * *